(12) United States Patent
Miura

(10) Patent No.: US 9,687,887 B2
(45) Date of Patent: Jun. 27, 2017

(54) SUBSTRATE PROCESSING APPARATUS

(71) Applicant: DAINIPPON SCREEN MFG. CO., LTD., Kyoto (JP)

(72) Inventor: Atsuyasu Miura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/386,997

(22) PCT Filed: Mar. 26, 2013

(86) PCT No.: PCT/JP2013/058819
§ 371 (c)(1),
(2) Date: Sep. 22, 2014

(87) PCT Pub. No.: WO2013/146793
PCT Pub. Date: Oct. 3, 2013

(65) Prior Publication Data
US 2015/0075571 A1    Mar. 19, 2015

(30) Foreign Application Priority Data
Mar. 29, 2012  (JP) ................. 2012-078181

(51) Int. Cl.
*B08B 3/10* (2006.01)
*H01L 21/67* (2006.01)

(52) U.S. Cl.
CPC ............ *B08B 3/10* (2013.01); *H01L 21/6708* (2013.01); *H01L 21/67051* (2013.01)

(58) Field of Classification Search
CPC .. H01L 21/67051; H01L 21/6708; B08B 3/10
See application file for complete search history.

(56) References Cited

U.S. PATENT DOCUMENTS

| 5,097,890 A | * | 3/1992 | Nakao | ..................... C30B 25/10 118/724 |
| 2003/0140945 A1 | * | 7/2003 | Chono | ..................... B08B 3/00 134/11 |

(Continued)

FOREIGN PATENT DOCUMENTS

| JP | 05-185011 | 7/1993 |
| JP | 11-165114 | 6/1999 |

(Continued)

OTHER PUBLICATIONS

International Search Report mailed Jun. 18, 2013 in corresponding PCT International Application No. PCT/JP2013/058819.

(Continued)

*Primary Examiner* — Michael Barr
*Assistant Examiner* — Benjamin L Osterhout
(74) *Attorney, Agent, or Firm* — Ostrolenk Faber LLP

(57) ABSTRACT

A substrate processing apparatus includes a substrate holding means that holds a substrate horizontally, a substrate rotating means that rotates a substrate held by the substrate holding means about a vertical rotation axis passing through the substrate, a discharging member that discharges a processing liquid toward the substrate, and a high-temperature processing liquid pipe that supplies a processing liquid of a temperature higher than that of the discharging member to the flow passage. The discharging member includes a plurality of discharge ports respectively disposed at a plurality of positions different in distance from the rotation axis and a flow passage connected sequentially to the plurality of discharge ports in order from outside to inside. The discharging member discharges a processing liquid supplied from the flow passage to the plurality of discharge ports from the plurality of discharge ports toward the substrate.

8 Claims, 9 Drawing Sheets

(56) References Cited

U.S. PATENT DOCUMENTS

| | | | | | |
|---|---|---|---|---|---|
| 2008/0066783 | A1* | 3/2008 | Tanaka | ............. | H01L 21/67028 134/21 |
| 2008/0141921 | A1* | 6/2008 | Hinderks | ................. | B63B 1/28 114/274 |
| 2010/0154833 | A1* | 6/2010 | Endo | ......................... | B08B 3/02 134/26 |
| 2010/0181290 | A1 | 7/2010 | Namba et al. | .................. | 216/92 |
| 2012/0175819 | A1* | 7/2012 | Miya | ................ | H01L 21/02052 264/334 |
| 2012/0318301 | A1* | 12/2012 | Higashijima | ....... | H01L 21/6719 134/26 |
| 2013/0014787 | A1* | 1/2013 | Urata | ............... | H01L 21/31133 134/100.1 |

FOREIGN PATENT DOCUMENTS

| | | |
|---|---|---|
| JP | 2006-344907 | 12/2006 |
| JP | 2007-258274 | 10/2007 |
| JP | 2009-021324 | 1/2009 |
| JP | 2010-192875 | 9/2010 |

OTHER PUBLICATIONS

Written Opinion mailed Jun. 18, 2013 in corresponding PCT International Application No. PCT/JP2013/058819.

International Preliminary Report on patentability (Chapter I) with a Notification from the International Bureau (Form PCT/IB/326) in corresponding PCT International Application No. PCT/JP2013/058819 dated Oct. 9, 2014.

English translation of the International Preliminary Report on Patentability (Chapter I) with a Notification from the International Bureau (Form PCT/IB/338) in corresponding PCT International Application No. PCT/JP2013/058819 dated Oct. 9, 2014.

\* cited by examiner

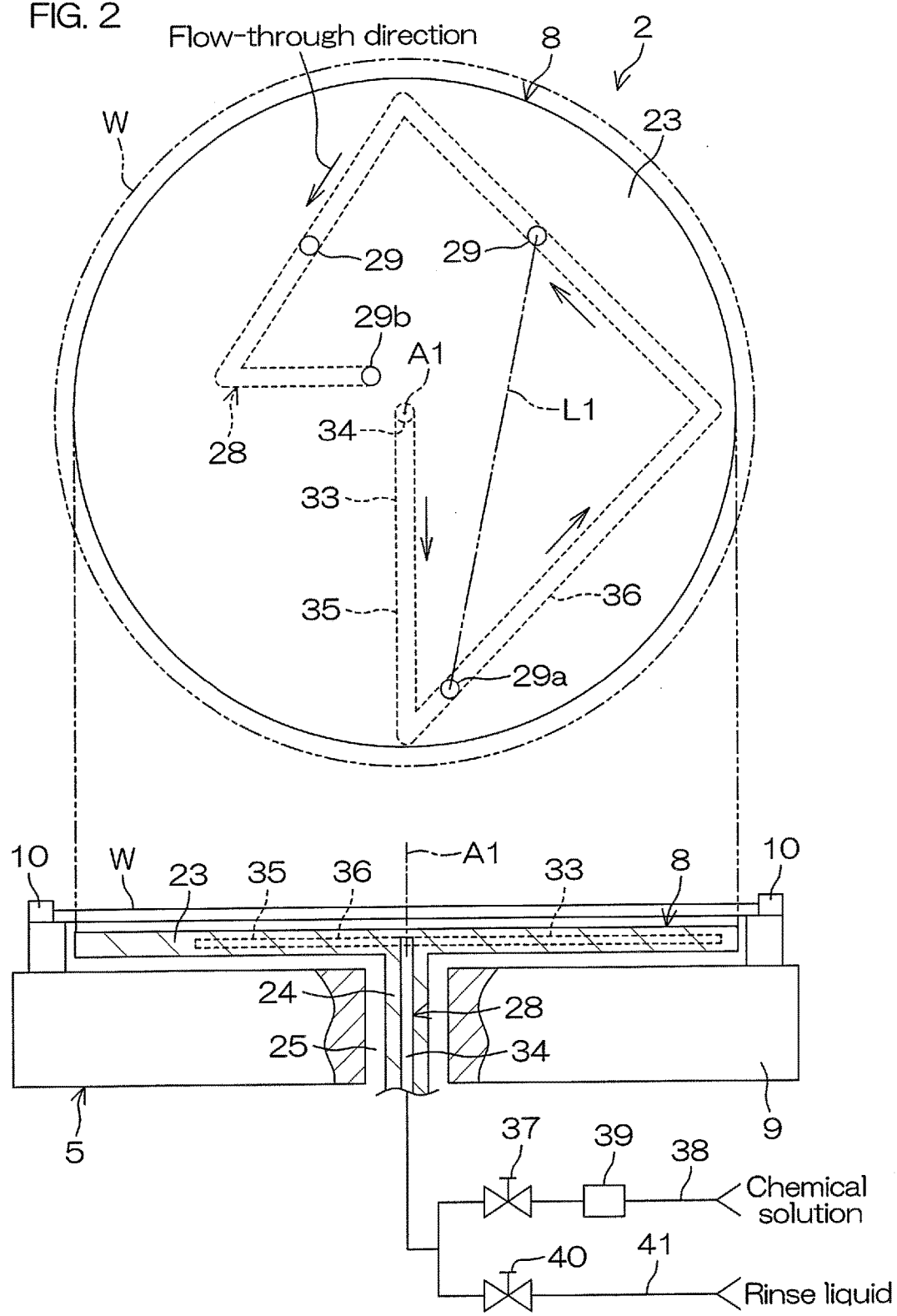

FIG. 3A  Chemical solution supply
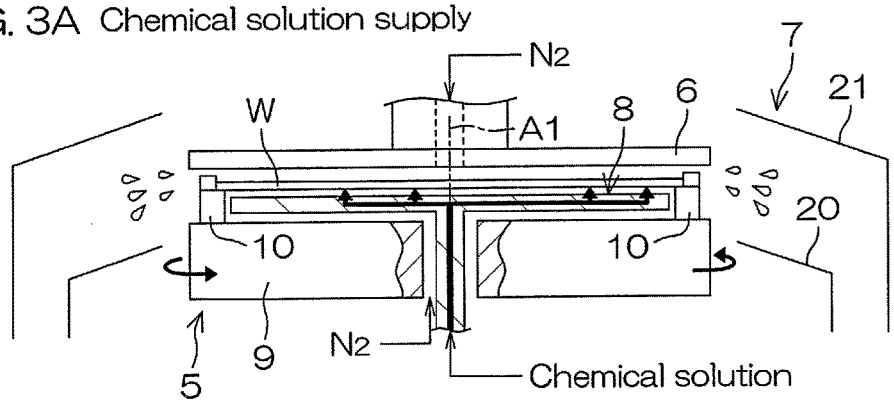
FIG. 3B  Rinse liquid supply
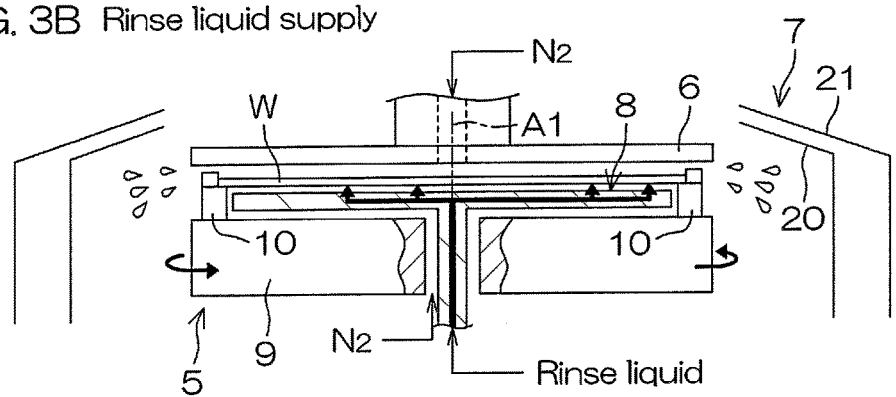
FIG. 3C  Dry
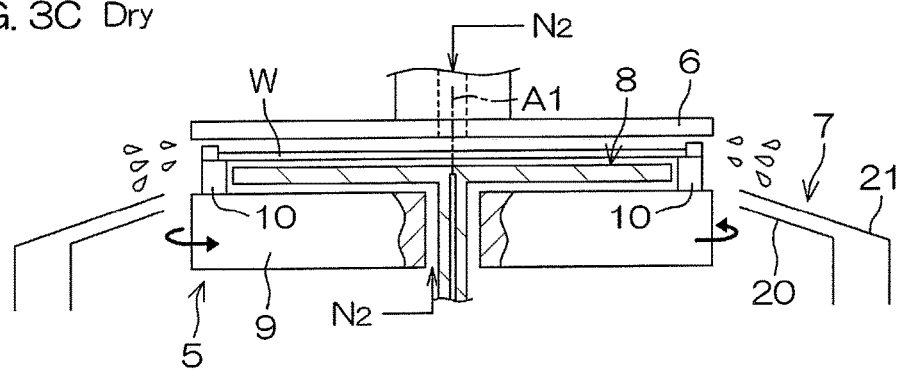

SUBSTRATE PROCESSING APPARATUS

CROSS-REFERENCE TO RELATED APPLICATIONS

The present application is a 35 U.S.C. §§371 national phase conversion of PCT/JP2013/058819, filed Mar. 26, 2013, which claims priority to Japanese Application No. 2012-078181, filed Mar. 29, 2012, the contents of both of which are incorporated herein by reference. The PCT International Application was published in the Japanese language.

TECHNICAL FIELD

The present invention relates to a substrate processing apparatus which processes a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

BACKGROUND ART

In a manufacturing process for a semiconductor device or a liquid crystal display device, etc., a substrate processing apparatus is used to process substrates, such as semiconductor wafers, glass substrates for liquid crystal display devices, etc.

A single substrate processing type substrate processing apparatus described in Patent Document 1 includes a spin chuck that horizontally holds and rotates a substrate, and a nozzle that discharges a processing liquid having a temperature higher than room temperature toward a central portion of an upper surface of the substrate in a rotating state. The high-temperature processing liquid discharged from the nozzle is landed on the upper surface central portion of the substrate, and spreads outward on the substrate by centrifugal force. The high-temperature processing liquid is thereby supplied to the entire upper surface of the substrate.

CITATION LIST

Patent Literature

Patent Document 1: Japanese Patent Application Publication No. 2006-344907

SUMMARY OF INVENTION

Technical Problem

The high-temperature processing liquid supplied to a central portion of the substrate in a rotating state moves from the central portion of the substrate to a peripheral edge portion of the substrate by centrifugal force. The temperature of the processing liquid gradually falls in the process. Therefore, the temperature of the processing liquid in the peripheral edge portion becomes lower than the temperature in the central portion, so that the uniformity of processing degrades. In order to prevent the degradation in uniformity, a method of discharging a processing liquid of an equal temperature toward a plurality of positions in a substrate can be considered. However, even if this method is adopted, the degradation in uniformity cannot be sufficiently prevented in some cases because the peripheral edge portion of a substrate has a larger area than that of the central portion and has a greater heat capacity than that of the central portion.

Therefore, it is an object of the present invention to provide a substrate processing apparatus capable of processing a substrate uniformly throughout the entire surface.

Solution to Problem

A preferred embodiment of the present invention for achieving the object provides a substrate processing apparatus including a substrate holding means that holds a substrate horizontally, a substrate rotating means that rotates a substrate held by the substrate holding means about a vertical rotation axis passing through the substrate, a discharging member that includes a plurality of discharge ports respectively disposed at a plurality of positions different in distance from the rotation axis, and a flow passage connected sequentially to the plurality of discharge ports in order from outside to inside, and discharges a processing liquid supplied from the flow passage to the plurality of discharge ports from the plurality of discharge ports toward the substrate, and a high-temperature processing liquid pipe that supplies a processing liquid of a temperature higher than that of the discharging member to the flow passage. The processing liquid may be a chemical solution such as an etching liquid, or may be a rinse liquid such as pure water (deionzied water). Of course, a liquid other than the chemical solution and rinse liquid may be used as the processing liquid.

According to this arrangement, a processing liquid of a temperature higher than that of the discharging member is supplied from the high-temperature processing liquid pipe to the discharging member, and discharged from the discharging member toward a substrate horizontally held by the substrate holding means. The processing liquid is thereby supplied to the substrate. When the discharging member discharges the processing liquid in a state where the substrate rotating means is rotating the substrate about the vertical rotation axis passing through the substrate, the processing liquid supplied to the substrate spreads radially outward by centrifugal force and spreads circumferentially toward the downstream side in a rotation direction. The processing liquid is thereby supplied to a wide range in the substrate.

The discharging member includes a plurality of discharge ports respectively disposed at a plurality of positions different in distance from the rotation axis and a flow passage connected sequentially to the plurality of discharge ports in order from outside to inside. The processing liquid from the high-temperature processing liquid pipe is supplied to the flow passage. Then, the processing liquid supplied to the flow passage is supplied sequentially to the plurality of discharge ports in order from outside to inside. Because the temperature of the processing liquid is higher than the temperature of the discharging member, the temperature of the processing liquid flowing in the flow passage gradually falls with an increase in staying time in the flow passage. Therefore, a processing liquid of a temperature lower than that of the processing liquid supplied to an outer discharge port is supplied to a discharge port on the inner side of the outer discharge port. In other words, a processing liquid of a temperature higher than that of the processing liquid supplied to an inner discharge port is supplied to a discharge port on the outer side of the inner discharge port.

A processing liquid discharged from an outer discharge port is supplied to a region (region in the substrate) further on the outer side than a region to which a processing liquid discharged from a discharge port on the inner side of the outer discharge port is supplied. To an outer discharge port, a processing liquid of a temperature higher than that of the processing liquid to be supplied to a discharge port on the inner side of the outer discharge port is supplied. Thus, the temperature of a processing liquid to be supplied to the substrate increases with distance from the rotation axis. The temperature of the processing liquid on the substrate decreases with distance from the rotation axis. Therefore, it is possible to make the temperature of the processing liquid on the substrate uniform throughout the entire surface by supplying a processing liquid having a temperature higher than that of the processing liquid to be supplied to an inner region to a region on the outer side of the inner region. The uniformity of processing can thereby be enhanced. Further, because a processing liquid is supplied from the common flow passage to the plurality of discharge ports, the structure of the discharging member can be further simplified than when a flow passage is provided for each of the discharge ports.

The discharging member may include an upward discharging member disposed under a position to hold a substrate by the substrate holding means. According to this arrangement, a processing liquid discharged upward from the upward discharging member is supplied to a lower surface of the substrate. The entire lower surface of the substrate can thereby be uniformly processed. Also, the discharging member may include a downward discharging member disposed over a position to hold a substrate by the substrate holding means. According to this arrangement, a processing liquid discharged downward from the downward discharging member is supplied to an upper surface of the substrate. The entire upper surface of the substrate can thereby be uniformly processed.

Also, the plurality of discharge ports may include two discharge ports disposed on rotation radiuses different from each other, and adjacent in a flow-through direction of a processing liquid in the flow passage.

The processing liquid supplied to the substrate in a rotating state spreads radially outward by centrifugal force and spreads circumferentially toward the downstream side in a rotation direction. Where two discharge ports adjacent in the flow-direction are disposed on a common rotation radius, because the landing positions of processing liquids are side by side in the rotation radial direction, processing liquids discharged from the two discharge ports are instantly mixed on the substrate. Therefore, the processing liquids different in temperature may be mixed with each other on the substrate to change in temperature immediately. Thus, disposing two discharge ports adjacent in the flow-through direction on rotation radiuses different from each other allows suppressing or preventing the processing liquids discharged from the two discharge ports from instantly mixing on the substrate.

Also, the flow passage may extend from one to the other of two discharge ports adjacent in a flow-through direction of a processing liquid in the flow passage, through a path different from a straight line to connect the two discharge ports. The shape of the flow passage between two discharge ports adjacent in the flow-through direction may be in a broken line shape, or may be in a curved shape. Also, the flow passage may intersect or may not intersect the straight line to connect two discharge ports adjacent in the flow-through direction.

According to this arrangement, the flow passage length from one to the other of two discharge ports adjacent in the flow-through direction is longer than when the flow passage extends along the straight line to connect the two adjacent discharge ports. When the flow passage length increases, the staying time of the processing liquid in the flow passage increases. The temperature of the processing liquid flowing in the flow passage gradually falls with an increase in staying time in the flow passage. Thus, the difference in temperature of processing liquids to be supplied to the two adjacent discharge ports can be increased by increasing the flow passage length. Processing liquids of different temperatures can thereby be reliably supplied to a plurality of regions in the substrate.

Also, the flow passage may include an upstream portion disposed further on an upstream side than an outermost discharge port among the plurality of discharge ports and extending from the rotation axis to an outer end portion of the discharging member, and a downstream portion connected to the upstream portion and disposed on the same plane as that of the upstream portion. The outer end portion of the discharging member is a portion opposing a peripheral edge portion of the substrate. According to this arrangement, a processing liquid from the high-temperature processing liquid pipe is supplied from the upstream portion to the downstream portion, and thereafter supplied from the downstream portion sequentially to the plurality of discharge ports. Because the upstream portion and the downstream portion are disposed on the same plane, the discharging member can be made smaller than when the upstream portion and the downstream portion are disposed on planes different from each other.

Also, the flow passage may include an upstream portion disposed further on an upstream side than an outermost discharge port among the plurality of discharge ports and extending from the rotation axis to an outer end portion of the discharging member, and a downstream portion connected to the upstream portion and disposed on a plane different from that of the upstream portion. The outer end portion of the discharging member is a portion opposing a peripheral edge portion of the substrate. According to this arrangement, a processing liquid from the high-temperature processing liquid pipe is supplied from the upstream portion to the downstream portion, and thereafter supplied from the downstream portion sequentially to the plurality of discharge ports. Because the upstream portion and the downstream portion are disposed on planes different from each other, the shape of the downstream portion is not restricted by the upstream portion. Therefore, the degree of freedom in the shape of the downstream portion can be increased.

Also, the substrate processing apparatus may further include a low-temperature processing liquid pipe that supplies to the flow passage a processing liquid of a temperature lower than that of a processing liquid that is supplied from the high-temperature processing liquid pipe to the flow passage, a switching device capable of opening and closing an interior of the high-temperature processing liquid pipe and low-temperature processing liquid pipe such that a processing liquid is selectively supplied to the flow passage from either one of the high-temperature processing liquid pipe and low-temperature processing liquid pipe, and a control device that, by controlling the switching device, executes a high-temperature processing liquid supplying step of supplying a processing liquid from the high-temperature processing liquid pipe to the flow passage, and a low-temperature processing liquid supplying step of supplying a processing liquid from the low-temperature processing liquid pipe to the flow passage after the high-temperature processing liquid supplying step. The processing liquid to be supplied from the low-temperature processing liquid pipe to the discharging member may be the same type of processing liquid as the processing liquid to be supplied from the high-temperature processing liquid pipe to the discharging member, or may be a different type of processing liquid from the processing liquid to be supplied from the high-temperature processing liquid pipe to the discharging member.

According to this arrangement, the control device controls the switching device capable of opening and closing the interior of the high-temperature processing liquid pipe and low-temperature processing liquid pipe. The control device causes a processing liquid from the high-temperature processing liquid pipe to be supplied to the flow passage of the discharging member, and thereafter causes a processing liquid from the low-temperature processing liquid pipe to be supplied to the flow passage of the discharging member. Because the temperature of the processing liquid to be supplied from the high-temperature processing liquid pipe to the discharging member is higher than the temperature of the discharging member, when the processing liquid from the high-temperature processing liquid pipe is supplied to the discharging member, the temperature of the discharging member rises. Also, because the temperature of the processing liquid to be supplied from the low-temperature processing liquid pipe to the discharging member is lower than the temperature of the processing liquid to be supplied from the high-temperature processing liquid pipe to the discharging member, when the processing liquid from the low-temperature processing liquid pipe is supplied to the discharging member after the processing liquid from the high-temperature processing liquid pipe is supplied to the discharging member, the temperature of the discharging member falls to approximate its original temperature. Therefore, it is suppressed or prevented that a processing liquid, a temperature of which is different from that of the processing liquid previously supplied to the substrate, is supplied to the substrate when the processing liquid from the high-temperature processing liquid pipe is again supplied to the discharging member. The temperature reproducibility can thereby be enhanced. Thus, the stability of processing can be enhanced.

Also, the substrate processing apparatus may further include a cooling structure including a cooling substance disposition space which is provided in an interior of the discharging member and in which a cooling substance to cool the discharging member is disposed.

According to this arrangement, the discharging member is cooled by the cooling substance disposed in the cooling substance disposition space provided in the interior of the discharging member. As described above, because the temperature of the processing liquid to be supplied from the high-temperature processing liquid pipe to the discharging member is higher than the temperature of the discharging member, when the processing liquid from the high-temperature processing liquid pipe is supplied to the discharging member, the temperature of the discharging member rises. The discharging member is cooled by the cooling substance to approximate its original temperature (temperature before the processing liquid from the high-temperature processing liquid pipe is supplied). Therefore, it is suppressed or prevented that a processing liquid, a temperature of which is different from that of the processing liquid previously supplied to the substrate, is supplied to the substrate when the processing liquid from the high-temperature processing liquid pipe is again supplied to the discharging member.

The cooling substance may be a solid. Specifically, the cooling structure may include a cooling member serving as the cooling substance, having a smaller specific heat than that of the discharging member. According to this arrangement, because the cooling member has a smaller specific heat than that of the discharging member, the discharging member is reliably cooled by the cooling substance. The temperature of the discharging member thereby approximates the original temperature.

Also, the cooling substance may be a liquid (cooling liquid). Specifically, the cooling substance disposition space may include a cooling liquid retention space to retain a cooling liquid serving as the cooling substrate. In this case, the cooling liquid retention space may be a sealed space filled with the cooling liquid.

Also, when the cooling substance is a liquid (cooling liquid), the cooling structure may include a cooling liquid flow passage serving as the cooling liquid retention space, a cooling liquid supply passage which is connected to the cooling liquid flow passage and supplies a cooling liquid to the cooling liquid flow passage, and a cooling liquid discharge passage which is connected to the cooling liquid flow passage and discharges a cooling liquid in the cooling liquid flow passage. According to this arrangement, a warmed cooling liquid in the cooling liquid retention space is discharged to the cooling liquid discharge passage, and replaced with a cooling liquid from the cooling liquid supply passage. Therefore, the discharging member is reliably cooled by the cooling liquid in the cooling liquid retention space.

The foregoing and other objects, features, and advantages of the present invention will become more apparent from the description of preferred embodiments provided below with reference to the accompanying drawings.

BRIEF DESCRIPTION OF DRAWINGS

FIG. 2 is a schematic view showing an upper surface and a longitudinal section of a lower surface nozzle provided in the processing unit according to the first preferred embodiment of the present invention.

FIG. 3A is a schematic view for describing an example of processing of a substrate that is performed by the processing unit.

FIG. 3B is a schematic view for describing an example of processing of a substrate that is performed by the processing unit.

FIG. 3C is a schematic view for describing an example of processing of a substrate that is performed by the processing unit.

DESCRIPTION OF PREFERRED EMBODIMENTS

Figure 1:
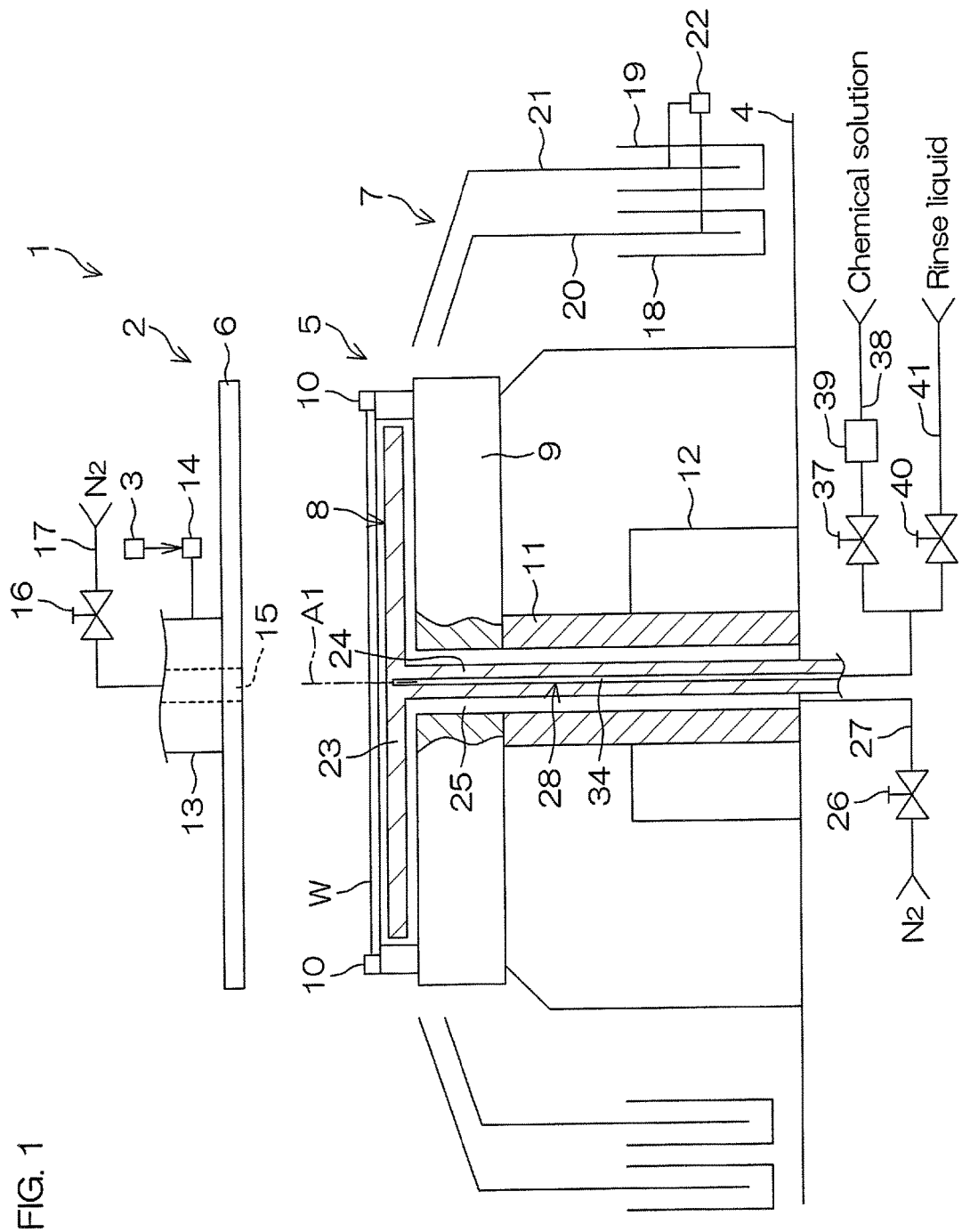
FIG. 1 is a schematic view in the horizontal direction of the interior of a processing unit provided in a substrate processing apparatus according to a first preferred embodiment of the present invention.

FIG. 1 is a schematic view in the horizontal direction of the interior of a processing unit 2 provided in a substrate processing apparatus 1 according to a first preferred embodiment of the present invention.

The substrate processing apparatus 1 is a single substrate processing type apparatus that processes disk-shaped substrates W such as semiconductor wafers one each at a time. The substrate processing apparatus 1 includes a plurality of processing units 2 and a control device 3 that controls devices provided in the substrate processing apparatus 1 and opening and closing of valves provided in the substrate processing apparatus 1.

The processing unit 2 includes a chamber 4 including a partition (not shown), a spin chuck 5 that horizontally holds the substrate W in the chamber 4 and rotates the substrate W about a vertical rotation axis A1 passing through the center of the substrate W, a shielding plate 6 disposed over the spin chuck 5 in the chamber 4, a cylindrical cup 7 that surrounds the spin chuck 5 in the chamber 4, and a lower surface nozzle 8 that discharges a processing liquid toward a lower surface of the substrate W.

The spin chuck 5 includes a disk-shaped spin base 9 held in a horizontal posture, a plurality of chuck pins 10 disposed on the spin base 9, a rotation shaft 11 extending downward from a central portion of the spin base 9, and a spin motor 12 that rotates the spin base 9 and the rotation shaft 11 about a vertical axis (rotation axis A1) passing through the center of the spin base 9. The spin chuck 5 holds (sandwiches) the substrate W in a horizontal posture at a holding position (the position of the substrate W shown in FIG. 1) over the spin base 9 by causing the plurality of chuck pins 10 to contact a peripheral end surface of the substrate W. Further, the spin chuck 5 rotates the spin base 9 and the rotation shaft 11 by the spin motor 12 in a state of holding the substrate W. The substrate W thereby rotates about the rotation axis A1.

The shielding plate 6 has a disk shape having a larger diameter than that of the substrate W. The shielding plate 6 is supported in a horizontal posture by a support 13 extending in the up-down direction. A central axis of the shielding plate 6 is disposed on the rotation axis A1. A lower surface of the shielding plate 6 is parallel to an upper surface of the substrate W, and is opposed to the entire upper surface of the substrate W. The shielding plate 6 is coupled to a shielding plate raising and lowering unit 14 via the support 13. The shielding plate raising and lowering unit 14 raises and lowers the shielding plate 6 between a proximity position (the position shown in FIG. 3A to FIG. 3B) where the lower surface of the shielding plate 6 approximates the upper surface of the substrate W and a retraction position (the position shown in FIG. 1) provided over the proximity position.

The support 13 has a cylindrical shape. The interior of the support 13 communicates with a through-hole that penetrates through a central portion of the shielding plate 6 in the up-down direction. The shielding plate 6 and the support 13 form an upper gas flow passage 15 extending in the up-down direction. The processing unit 2 includes an upper gas pipe 17 having an upper gas valve 16 interposed therein. The upper gas pipe 17 is connected to the upper gas flow passage 15. The lower end (upper gas discharge port) of the upper gas flow passage 15 is opened in a lower surface central portion of the shielding plate 6. Thus, when the upper gas valve 16 is opened, a gas supplied from the upper gas pipe 17 to the upper gas flow passage 15 is discharged downward from the lower surface central portion of the shielding plate 6. The gas to be supplied to the upper gas flow passage 15 is, for example, nitrogen gas. The gas may be an inert gas other than nitrogen gas such as argon, or may be another gas such as dry air or clean air.

The cup 7 includes a cylindrical inner cup 18 and a cylindrical outer cup 19 that surround the spin cuck 5, a cylindrical inner guard 20 and a cylindrical outer guard 21 that surround the spin cuck 5, and a guard raising and lowering unit 22 that raises and lowers the inner guard 20 and the outer guard 21 independently. The inner cup 18 and the outer cup 19 form annular grooves opened upward. The inner cup 18 and the outer cup 19 are connected to a recovery device or a waste fluid disposal device (not shown). An upper end portion of the inner guard 20 extends obliquely upward toward the rotation axis A1, and a lower end portion of the inner guard 20 is disposed over the inner cup 18. Similarly, an upper end portion of the outer guard 21 extends obliquely upward toward the rotation axis A1, and a lower end portion of the outer guard 21 is disposed above the outer cup 19. The inner diameters at the upper end of the inner guard 20 and the outer guard 21 are larger than the outer diameter of the spin base 9.

The guard raising and lowering unit 22 raises and lowers the respective guards between an up-position where the upper end of the guard is located higher than the substrate W and a down-position where the upper end of the guard is located lower than the substrate W. FIG. 1 shows a state in which both of the inner guard 20 and the outer guard 21 are disposed at the down-positions. In a state where both of the inner guard 20 and the outer guard 21 are disposed at the up-positions, an inner surface of the inner guard 20 opposes the peripheral end surface of the substrate W. In this state, the processing liquid shaken off to the periphery of the substrate W is received by the inner surface of the inner guard 20, and guided into the inner cup 18. Alternatively, in a state where the inner guard 20 is disposed at the down-position and the outer guard 21 is disposed at the up-position, an inner surface of the outer guard 21 opposes the peripheral end surface of the substrate W. In this state, the processing liquid shaken off to the periphery of the substrate W is received by the inner surface of the outer guard 21, and guided into the inner cup 19. Then, the processing liquid collected into the inner cup 18 and the outer cup 19 is recovered or disposed of.

The lower surface nozzle 8 includes a discharge portion 23 that discharges the processing liquid toward the lower surface of the substrate W and a supply portion 24 that supplies the processing liquid to the discharge portion 23. The discharge portion 23 and the supply portion 24 are made of a material having chemical resistance such as resin. As such material, for example, PCTFE (polychlorotrifluoroethylene), PFA (tetrafluoroethylene-perfluoroalkyl vinyl ether copolymer), and PP (polypropylene) can be mentioned.

The discharge portion 23 is disposed between the lower surface of the substrate W and an upper surface of the spin base 9. The discharge portion 23 has a disk shape having a smaller diameter than that of the substrate W. The discharge portion 23 is held in a horizontal posture. An upper surface of the discharge portion 23 is opposed parallel to the lower surface of the substrate W with a gap in the up-down direction therebetween. An outer peripheral portion of the discharge portion 23 is disposed inside (the side of the rotation axis A1) of the chuck pins 10, and opposed in the up-down direction to a lower surface peripheral edge portion of the substrate W.

The supply portion 24 extends downward from a central portion of the discharge portion 23. The discharge portion 23 may be integral with the supply portion 24, or may be a member different from the supply portion 24. The supply portion 24 extends in the up-down direction along the rotation axis A1. The supply portion 24 has a cylindrical shape extending in the up-down direction. The supply portion 24 is inserted into a through-hole that penetrates through the spin base 9 and the rotation shaft 11 in the up-down direction. The spin base 9 and the rotation shaft 11 surround the supply portion 24 with a gap in the radial direction. Thus, a lower gas flow passage 25 in a cylindrical shape extending in the up-down direction is formed between the spin base 9 and the rotation shaft 11 and the supply portion 24.

The processing unit 2 includes a lower gas pipe 27 having a lower gas valve 26 interposed therein. The lower gas pipe 27 is connected to the lower gas flow passage 25. The upper end (lower gas discharge port) of the lower gas flow passage 25 is opened in the upper surface of the spin base 9. The upper end of the lower gas flow passage 25 is disposed under the discharge portion 23. When the lower gas valve 26 is opened, a gas supplied from the lower gas pipe 27 to the lower gas flow passage 25 is discharged upward from an upper surface central portion of the spin base 9. The gas to be supplied to the lower gas flow passage 25 is, for example, nitrogen gas. The gas may be an inert gas other than nitrogen gas such as argon, or may be another gas such as dry air or clean air.

FIG. 2 is a schematic view showing an upper surface and a longitudinal section of the lower surface nozzle 8 provided in the processing unit 2 according to the first preferred embodiment of the present invention.

The lower surface nozzle 8 includes a flow passage 28 through which the processing liquid flows and a plurality of discharge ports 29 that discharge the processing liquid supplied from the flow passage 28. The flow passage 28 includes a first flow passage 33 provided in the interior of the discharge portion 23 and a second flow passage 34 provided in the interior of the rotation shaft 11. The second flow passage 34 extends in the up-down direction along the rotation axis A1. The first flow passage 33 is connected to the second flow passage 34 on the rotation axis A1. The first flow passage 33 extends so as to stretch out from the central portion of the discharge portion 23 up to the outer peripheral portion of the discharge portion 23 and return from the outer peripheral portion of the discharge portion 23 to the central portion of the discharge portion 23. FIG. 2 shows an example in which the first flow passage 33 has a broken line shape.

The plurality of discharge ports 29 extend upward from the first flow passage 33. The plurality of discharge ports 29 are opened in the upper surface of the discharge portion 23. The plurality of discharge ports 29 are respectively disposed at a plurality of positions that are different in distance (the minimum distance) from the rotation axis A1. The outermost discharge port 29a is opposed to the lower surface peripheral edge portion of the substrate W, and the innermost discharge port 29b is opposed to a lower surface central portion of the substrate W. The first flow passage 33 is connected sequentially to the plurality of discharge ports 29 in order from outside to inside according to the distance from the rotation axis A1. Thus, a discharge port 29, which is disposed further on a downstream side than other discharge port 29, is disposed closer to the rotation axis A1.

The first flow passage 33 includes an upstream portion 35 disposed further on the upstream side than the outermost discharge port 29a among the plurality of discharge ports 29 and extending from the rotation axis A1 to an outer end portion (outer peripheral portion) of the discharge portion 23 and a downstream portion 36 connected to the upstream portion 35 and disposed on the same plane as that of the upstream portion 35. The first flow passage 33 extends from one to the other of two discharge ports 29 adjacent in the flow-through direction of the processing liquid in the flow passage 28, through a path different from a straight line L1 to connect the two discharge ports 29. The plurality of discharge ports 29 are disposed on radiuses different from each other. Thus, two discharge ports 29 adjacent in the flow-through direction are disposed on radiuses different from each other. The gap in the radial direction of two discharge ports 29 adjacent in the flow-through direction may be fixed or different.

The processing unit 2 includes a chemical solution pipe 38 having a chemical solution valve 37 interposed therein, a heater 39 that heats a chemical solution supplied to the chemical solution pipe 38 to a temperature higher than room temperature (20 to 30° C.), and a rinse liquid pipe 41 having a rinse liquid valve 40 interposed therein. The chemical solution pipe 38 and the rinse liquid pipe 41 are connected to the flow passage 28. When the chemical solution value 37 is opened, a chemical solution of a temperature higher than room temperature having been adjusted in temperature by the heater 39 is supplied from the chemical solution pipe 38 to the flow passage 28. When the rinse liquid valve 40 is opened, a rinse liquid of room temperature is supplied from the rinse liquid pipe 41 to the flow passage 28.

The chemical solution to be supplied to the lower surface nozzle 8 is, for example, hydrofluoric acid, and the rinse liquid to be supplied to the lower surface nozzle 8 is, for example, pure water (deionzied water). The chemical solution is not limited to hydrofluoric acid, but may be a solution containing at least one of the sulfuric acid, acetic acid, nitric acid, hydrochloric acid, hydrofluoric acid, aqueous ammonia, hydrogen peroxide solution, organic acid (e.g., citric acid or oxalic acid), organic alkali (e.g., TMAH: tetramethylammonium hydroxide), surfactant, and corrosion inhibitor. For example, any of the BHF (mixture solution containing HF and $NH_4F$), fluoronitric acid (mixture solution containing HF and $HNO_3$), SC-1 (mixture solution containing $NH_4OH$ and $H_2O_2$), SC-2 (mixture solution containing HCl and $H_2O_2$), and TMAH may be supplied to the lower surface nozzle 8. Also, the rinse liquid is not limited to pure water, but may be any one of the carbonated water, electrolyzed ion water, hydrogen water, ozone water, and aqueous hydrochloric acid of a dilute concentration (e.g., about 10 to 100 ppm).

When the chemical solution valve 37 is opened, the chemical solution of a temperature higher than room temperature is supplied to the first flow passage 33 via the second flow passage 34. The chemical solution supplied to the first flow passage 33 flows inside the first flow passage 33 toward the downstream end of the first flow passage 33. Because the first flow passage 33 is connected to the plurality of discharge ports 29 in order from outside to inside, the chemical solution supplied to the first flow passage 33 is supplied to the outermost discharge port 29a, and the chemical solution moved further to the downstream side than the outermost discharge port 29a is supplied to the second outermost discharge port 29. Then, the chemical solution moved further to the downstream side than the second outermost discharge port 29 is supplied to the third outermost discharge port 29, and the chemical solution moved further to the downstream side than the third outermost discharge port 29 is supplied to the innermost discharge port 29b. In this manner, the chemical solution supplied to the first flow passage 33 is supplied to the plurality of discharge ports 29 in order from outside to inside.

The chemical solution supplied to the plurality of discharge ports 29 is discharged upward from each discharge port 29 toward the lower surface of the substrate W. The chemical solution landed on the lower surface of the substrate W spreads radially in the lower surface of the substrate W with that momentum. Further, when the chemical solution is discharged from each discharge port 29 in a state where the substrate W is rotating, the chemical solution landed on the lower surface of the substrate W spreads radially outward from the landing position and spreads circumferentially from the landing position toward the downstream side in a rotation direction. The chemical solution discharged from each discharge port 29 is thereby supplied to a region further outside than the landing position. The outermost discharge port 29a is opposed to the lower surface peripheral edge portion of the substrate W, and the innermost discharge port 29b is opposed to the lower surface central portion of the substrate W. Therefore, when the chemical solution is discharged from the plurality of discharge ports 29, the chemical solution is supplied to the entire lower surface of the substrate W.

The temperature of the chemical solution to be supplied to the discharge portion 23 is higher than room temperature, whereas the discharge portion 23 has room temperature, so that the chemical solution supplied to the first flow passage 33 gradually falls in temperature in the course of flowing inside the first flow passage 33. Therefore, the chemical solution of a temperature lower than that of the chemical solution that is supplied to an outer discharge port 29 is supplied to an inner discharge port 29. Thus, the temperature of the chemical solution that is supplied to a certain region in the lower surface of the substrate W is higher than the temperature of the chemical solution that is supplied to a region further inside than the region. As described above, the chemical solution discharged from each discharge port 29 spreads in the lower surface of the substrate W. Two discharge ports 29 adjacent in the flow-through direction are disposed on radiuses different from each other. Therefore, it is suppressed or prevented that the chemical solutions are mixed with each other in the lower surface of the substrate W immediately after the chemical solutions have landed on the lower surface of the substrate W.

Also, when the rinse liquid valve 40 is opened, the rinse liquid of room temperature is supplied to the first flow passage 33 via the second flow passage 34. Similar to the chemical solution, the rinse liquid supplied to the first flow passage 33 is supplied to the plurality of discharge ports 29 in order from outside to inside. Thereby, the rinse liquid is discharged upward from each discharge port 29 toward the lower surface of the substrate W, and the rinse liquid is supplied to the entire lower surface of the substrate W. After the chemical solution of a temperature higher than room temperature is supplied to the first flow passage 33, the discharge portion 23 has a raised temperature. Thus, when the rinse liquid of room temperature is supplied to the first flow passage 33 after the chemical solution is supplied to the first flow passage 33, the temperature of the discharge portion 23 falls to approximate room temperature. Therefore, it is suppressed or prevented that a chemical solution, a temperature of which is higher than that of the chemical solution previously supplied to the substrate, is supplied to the lower surface of the substrate W when the chemical solution of a temperature higher than room temperature is again supplied to the first flow passage 33. The temperature reproducibility of the chemical solution to be supplied to the substrate W can thereby be enhanced.

Where the diameter of the substrate W to be held by the spin chuck 5 is 300 mm and the clearance between the upper surface of the spin base 9 and the lower surface of the substrate W is 10 mm, the outer diameter of the discharge portion 23 is, for example, 290 mm, and the thickness of the discharge portion 23 is, for example, 6 mm. Further, in this case, the diameter of the first flow passage 33 is 4 mm. Further, in this case, the distances from the rotation axis A1 to the four discharge ports 29 are, for example, 4 mm, 50 mm, 90 mm, and 130 mm. Where the diameter of the substrate W is 300 mm and the rotation speed of the substrate W by the spin chuck 5 is within a range of 10 to 1500 rpm, the distance from the rotation axis A1 to the outermost discharge port 29a is preferably 130 mm or less. That is, when the distance to the outermost discharge port 29a exceeds 130 mm, the processing liquid supplied from the outermost discharge port 29a to the lower surface of the substrate W may scatter to the periphery of the substrate W before being distributed across the entire circumference of the substrate W. Thus, setting the distance to the outermost discharge port 29a to 130 mm or less allows distributing the processing liquid discharged from the outermost discharge port 29a across the entire circumference of the substrate W.

FIG. 3A, FIG. 3B, and FIG. 3C are schematic views each for describing an example of processing of a substrate W that is performed by the processing unit 2. In the following, description will be given of an example of processing when supplying hydrofluoric acid to the rear surface of a substrate W formed with a nitride film (for example, SiN) to thereby etch the nitride film. An example of the temperature of hydrofluoric acid to be supplied to the substrate W is 50° C., and an example of the concentration of hydrofluoric acid is 49%. Also, an example of the supply flow rate of hydrofluoric acid to the substrate W is 2 L/min.

When the substrate W is processed, a carry-in step of carrying the substrate W into the chamber 4 is performed. Specifically, the control device 3 causes the shielding plate 6 to be positioned at the retraction position, and causes the inner guard 20nd the outer guard 21 to be positioned at the down-positions. In this state, the control device 3 causes a transfer robot to carry the substrate W into the chamber 4. Thereafter, the control device 3 causes the transfer robot to place a lower surface peripheral edge portion of the substrate W on the chuck pin 10 with the rear surface of the substrate W facing down. Then, the control device 3 causes the chuck pins 10 to hold the substrate W. The control device 3 causes the transfer robot to retract from the chamber 4 after the substrate W is placed on the spin chuck 5.

Next, as shown in FIG. 3A, a chemical solution treatment step of supplying hydrofluoric acid being an example of the chemical solution to the lower surface of the substrate W is performed. Specifically, the control device 3 controls the spin chuck 5 to rotate the substrate W about the rotation axis A1 at a predetermined rotation speed (for example, 1250 rpm). Further, the control device 3 controls the shielding plate raising and lowering unit 14 to move the shielding plate 6 to the proximity position. Further, the control device 3 controls a cup raising and lowering unit 22 to move the outer guard 21 to the up-position. In this state, the control device 3 opens the upper gas valve 16 and the lower gas valve 26 to discharge nitrogen gas being an example of the gas from the lower surface central portion of the shielding plate 6 and the upper surface central portion of the spin base 9. Thereafter, the control device 3 opens the chemical solution valve 37 to discharge hydrofluoric acid from the lower surface nozzle 8. Then, when a predetermined time has elapsed after the chemical solution valve 37 is opened, the control device 3 closes the chemical solution valve 37 to stop the discharge of hydrofluoric acid from the lower surface nozzle 8.

The nitrogen gas discharged from lower surface central portion of the shielding plate 6 spreads outward in a space between the upper surface of the substrate W and the lower surface of the shielding plate 6. The nitrogen gas is thereby filled between the substrate W and the shielding plate 6. Similarly, the nitrogen gas discharged from the upper surface central portion of the spin base 9 spreads outward in a space between the lower surface of the substrate W and the upper surface of the spin base 9. The nitrogen gas is thereby filled between the substrate W and the spin base 9. Thus, the hydrofluoric acid discharged from the plurality of discharge ports 29 is supplied to the lower surface of the substrate W in a nitrogen gas atmosphere. Then, the hydrofluoric acid supplied to the lower surface of the substrate W is shaken off to the periphery of the substrate W by a centrifugal force due to rotation of the substrate W. The hydrofluoric acid shaken off to the periphery of the substrate W is received by the outer guard 21, and then recovered. In this manner, hydrofluoric acid is supplied to the entire lower surface of the substrate W, and the nitride film formed on the rear surface of the substrate W is thus uniformly etched.

Next, as shown in FIG. 3B, a rinsing step of supplying pure water being an example of the rinse liquid to the lower surface of the substrate W is performed. Specifically, the control device 3 controls the cup raising and lowering unit 22 to position both of the inner guard 20 and the outer guard 21 at the up-positions in a state where the substrate W is rotating at a predetermined rotation speed (e.g., 1250 rpm) and the shielding plate 6 is disposed at the proximity position. The inner surface of the inner guard 20 thereby opposes the peripheral end surface of the substrate W. In this state, the control device 3 opens the rinse liquid valve 40 to discharge pure water from the lower surface nozzle 8. Thus, pure water is discharged from the lower surface nozzle 8 in a state where nitrogen gas is being discharged from the lower surface central portion of the shielding plate 6 and the upper surface central portion of the spin base 9. Then, when a predetermined time has elapsed after the rinse liquid valve 40 is opened, the control device 3 closes the rinse liquid valve 40 to stop the discharge of pure water from the lower surface nozzle 8.

Similar to the case of hydrofluoric acid, because the shielding plate 6 is disposed at the proximity position and nitrogen gas is being discharged from the lower surface central portion of the shielding plate 6, the nitrogen gas is filled between the substrate W and the shielding plate 6. Similarly, because nitrogen gas is being discharged from the upper surface central portion of the spin base 9, the nitrogen gas is filled between the substrate W and the spin base 9. Therefore, the pure water discharged from the plurality of discharge ports 29 is supplied to the lower surface of the substrate W in a nitrogen gas atmosphere. Then, the pure water supplied to the lower surface of the substrate W is shaken off to the periphery of the substrate W by a centrifugal force due to rotation of the substrate W. The pure water shaken off to the periphery of the substrate W is received by the inner guard 20, and then disposed of. In this manner, pure water is supplied to the entire lower surface of the substrate W. Therefore, hydrofluoric acid adhered to the lower surface of the substrate W is rinsed off by the pure water.

Next, as shown in FIG. 3C, a drying step of drying the substrate W is performed. Specifically, the control device 3 controls the cup raising and lowering unit 22 to position both of the inner guard 20 and the outer guard 21 at the down-positions in a state where the shielding plate 6 is disposed at the proximity position. The upper ends of the inner guard 20 and the outer guard 21 are thereby disposed lower than the substrate W. In this state, the control device 3 controls the spin chuck 5 to accelerate rotation of the substrate W. Thus, the substrate W rotates at a high rotation speed (e.g., 2500 rpm) in a state where nitrogen gas is being discharged from the lower surface central portion of the shielding plate 6 and the upper surface central portion of the spin base 9. Therefore, the pure water adhered to the lower surface of the substrate W is shaken off to the periphery of the substrate W by a high-speed rotation of the substrate W. The pure water is thereby removed from the substrate W, and the substrate W dries in a nitrogen gas atmosphere. Therefore, the generation of watermarks is reduced.

Next, a carry-outstep of carrying out the substrate W from the chamber 4 is performed. Specifically, the control device 3 controls the spin chuck 5 to stop the rotation of the spin chuck 5. Further, the control device 3 closes the upper gas valve 16 and the lower gas valve 26 to stop the discharge of nitrogen gas from the lower surface central portion of the shielding plate 6 and the upper surface central portion of the spin base 9. Further, the control device 3 controls the shielding plate raising and lowering unit 14 to raise the shielding plate 6 from the proximity position to the retraction position. In this state, the control device 3 causes the transfer robot to enter into the chamber 4. Thereafter, the control device 3 causes the transfer robot to hold the substrate W on the spin chuck 5. Then, the control device 3 causes the transfer robot to retract from the chamber 4. Thereby, the substrate W is carried out from the chamber 4.

As above, in the present preferred embodiment, the lower surface nozzle 8 includes a plurality of discharge ports 29 respectively disposed at a plurality positions different in distance from the rotation axis A1 and a flow passage 28 connected sequentially to the plurality of discharge ports 29 in order from outside to inside. The chemical solution from the chemical solution pipe 38 is supplied to the flow passage 28. Then, the chemical solution supplied to the flow passage 28 is supplied sequentially to the plurality of discharge ports 29 in order from outside to inside. Because the temperature of the chemical solution is higher than the temperature of the lower surface nozzle 8, the temperature of the chemical solution flowing in the flow passage 28 gradually falls with an increase in staying time in the flow passage 28. Therefore, a chemical solution of a temperature lower than that of the chemical solution supplied to an outer discharge port 29 is supplied to a discharge port 29 on the inner side of the outer discharge port 29. In other words, a chemical solution of a temperature higher than that of the chemical solution supplied to an inner discharge port 29 is supplied to a discharge port 29 on the outer side of the inner discharge port 29.

A chemical solution discharged from an outer discharge port 29 is supplied to a region (region in the substrate W) further on the outer side than a region to which a chemical solution discharged from a discharge port 29 on the inner side of the outer discharge port 29 is supplied. To an outer discharge port 29, a chemical solution of a temperature higher than that of the chemical solution to be supplied to a discharge port 29 on the inner side of the outer discharge port 29 is supplied. Thus, the temperature of a chemical solution to be supplied to the substrate W increases with distance from the rotation axis A1. The temperature of the chemical solution on the substrate W decreases with distance from the rotation axis A1. Therefore, supplying a chemical solution of a temperature higher than that of the chemical solution to be supplied to an inner region to a region on the outer side of the inner region can make the temperature of the chemical solution on the substrate W uniform throughout the entire surface. The uniformity of processing can thereby be enhanced. Further, because a chemical solution is supplied from the common flow passage 28 to the plurality of discharge ports 29, the structure of the lower surface nozzle 8 can be further simplified than when a flow passage is provided for each of the discharge ports 29.

Figure 4:
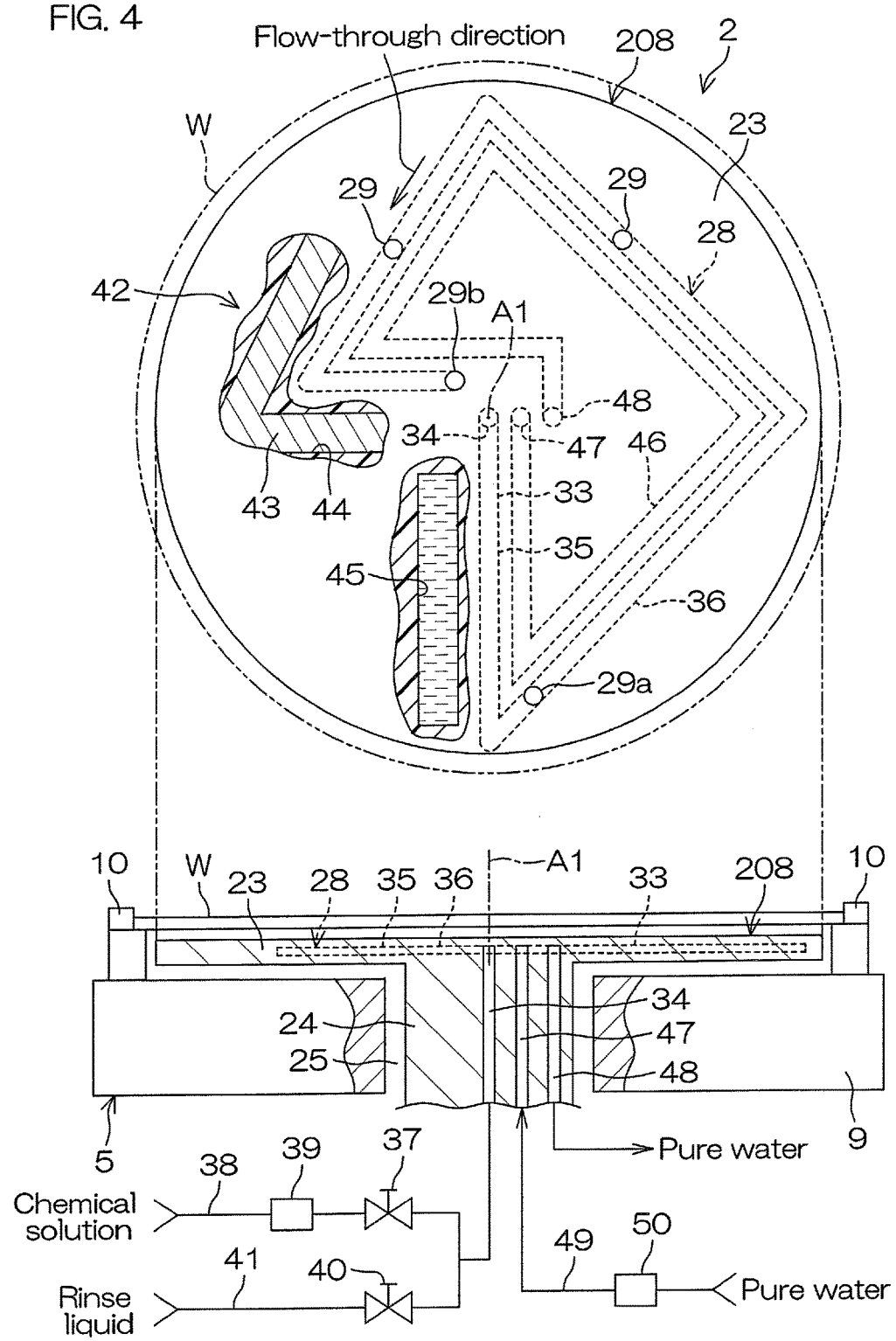
FIG. 4 is a schematic view showing an upper surface and a longitudinal section of a lower surface nozzle provided in a processing unit according to a second preferred embodiment of the present invention.

FIG. 4 is a schematic view showing an upper surface and a longitudinal section of a lower surface nozzle 208 provided in a processing unit 2 according to a second preferred embodiment of the present invention. In FIG. 4, components equivalent to respective portions shown in FIG. 1 to FIG. 3 described above are designated by the same reference signs as in FIG. 1 etc., and description thereof shall be omitted.

The lower surface nozzle 208 according to the second preferred embodiment includes a cooling structure 42 besides the arrangement of the lower surface nozzle 8 according to the first preferred embodiment.

The cooling structure 42 includes a cooling member 43 having a smaller specific heat than that of the discharge portion 23. The cooling member 43 is disposed in a disposition space 44 provided in the interior of the discharge portion 23. Thus, the cooling member 43 is filled into the discharge portion 23. Where the discharge portion 23 is made of a resin, at least a portion of the cooling member 43 is made of a metal. When the temperature of the discharge portion 23 rises due to supply of a high-temperature chemical solution, the discharge portion 23 is cooled by the cooling member 43. Therefore, it is suppressed or prevented that a chemical solution, a temperature of which is different from that of the high-temperature chemical solution previously supplied to the substrate W, is supplied to the substrate W when the high-temperature chemical solution from the chemical solution pipe 38 is again supplied to the discharge portion 23. The temperature reproducibility can thereby be enhanced, and the stability of processing can be enhanced.

Also, the cooling structure 42 includes a cooling liquid retention space 45 provided in the interior of the discharge portion 23. The cooling liquid retention space 45 is a sealed space filled with a cooling liquid. The cooling liquid may be a liquid containing water such as pure water, or may be a liquid other than the liquid containing water.

The temperature of the cooling liquid is maintained at room temperature. When the chemical solution of a temperature higher than room temperature is supplied from the chemical solution pipe 38 to the discharge portion 23 and the temperature of the discharge portion 23 rises, the discharge portion 23 is cooled by the cooling liquid in the cooling liquid retention space 45. Therefore, it is suppressed or prevented that a chemical solution, a temperature of which is different from that of the high-temperature chemical solution previously supplied to the substrate W, is supplied to the substrate W when the high-temperature chemical solution from the chemical solution pipe 38 is again supplied to the discharge portion 23.

Also, the cooling structure 42 includes a cooling liquid flow passage 46 provided in the interior of the discharge portion 23, a cooling liquid supply passage 47 that supplies a cooling liquid to the cooling liquid flow passage 46, and a cooling liquid discharge passage 48 that discharges a cooling liquid in the cooling liquid flow passage 46. The cooling liquid flow passage 46 is provided in the interior of the discharge portion 23. The cooling liquid flow passage 46 extends along the first flow passage 33. The cooling liquid supply passage 47 is connected to the upstream end of the cooling liquid flow passage 46, and the cooling liquid discharge passage 48 is connected to the downstream end of the cooling liquid flow passage 46. The cooling liquid supply passage 47 and the cooling liquid discharge passage 48 are provided in the interior of the supply portion 24. The cooling liquid supply passage 47 and the cooling liquid discharge passage 48 extend in the up-down direction.

The cooling liquid supply passage 47 is connected to a cooling liquid pipe 49. The cooling liquid pipe 49 supplies to the cooling liquid supply passage 47 a cooling liquid regulated to a constant temperature lower than the temperature of a chemical solution to be supplied from the chemical solution pipe 38 to the flow passage 28. The temperature of the cooling liquid to be supplied from the cooling liquid pipe 49 to the cooling liquid supply passage 47 may be regulated before the cooling liquid is supplied to the substrate processing apparatus 1, or may be regulated by a temperature regulator 50 (heater or cooler) interposed in the cooling liquid pipe 49. Also, the temperature of the cooling liquid may be room temperature or more, or may be less than room temperature. An example of the temperature of the cooling liquid is, for example, 24 to 60° C. The cooling liquid supplied to the cooling liquid supply passage 47 is supplied from the cooling liquid supply passage 47 to the cooling liquid flow passage 46, and discharged from the cooling liquid flow passage 46 to the cooling liquid discharge passage 48. The cooling liquid is supplied to the cooling liquid supply passage 47 at all times. Thus, the temperature of the discharge portion 23 is maintained at the temperature of the cooling liquid. Therefore, it is suppressed or prevented that a chemical solution, a temperature of which is different from that of the high-temperature chemical solution previously supplied to the substrate W, is supplied to the substrate W when the high-temperature chemical solution from the chemical solution pipe 38 is again supplied to the discharge portion 23.

Although the first and second preferred embodiments of the present invention have been described above, the present invention is not limited to the contents of the first and second preferred embodiments described above, and can be variously modified within the scope of the claims.

Figure 5:
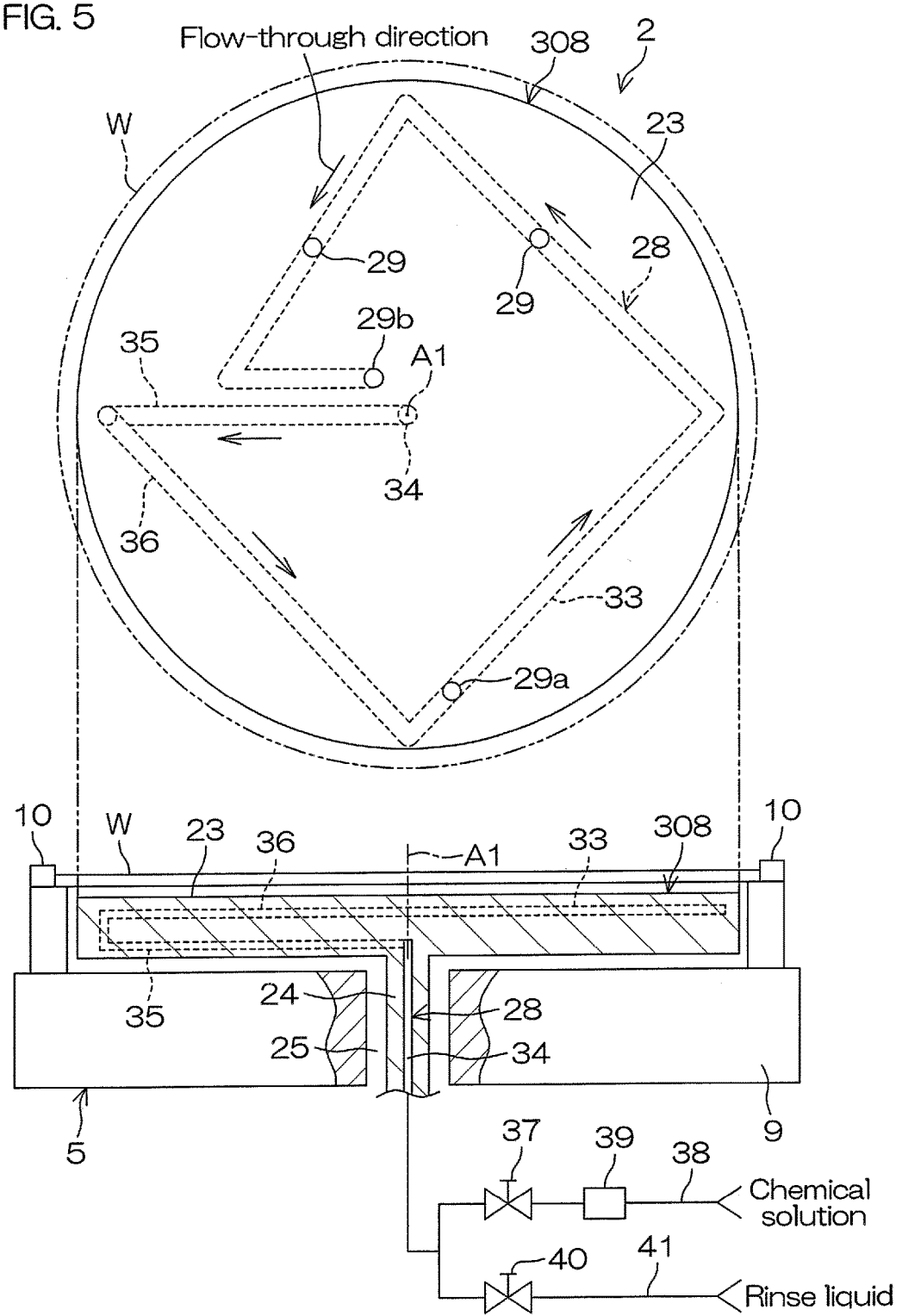
FIG. 5 is a schematic view showing an upper surface and a longitudinal section of a lower surface nozzle according to a third preferred embodiment of the present invention.

For example, in the first and second preferred embodiments, a description has been given of the case in which the upstream portion 35 and the downstream portion 36 of the first flow passage 33 are disposed on the same plane, but as in the lower surface nozzle 308 shown in FIG. 5, the upstream portion 35 and the downstream portion 36 of the first flow passage 33 may be disposed on planes different from each other.

Figure 6:
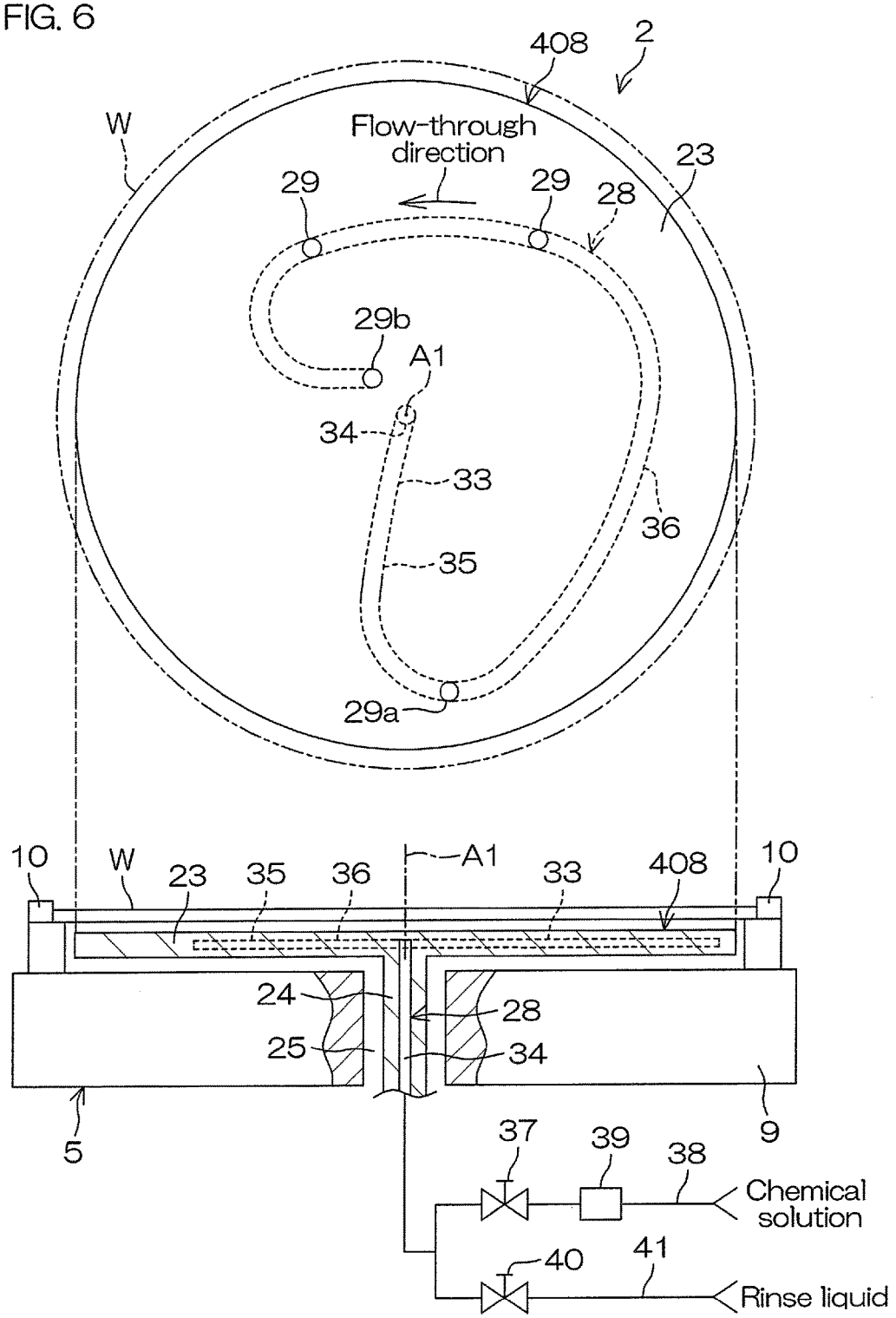
FIG. 6 is a schematic view showing an upper surface and a longitudinal section of a lower surface nozzle according to a fourth preferred embodiment of the present invention.
Figure 7:
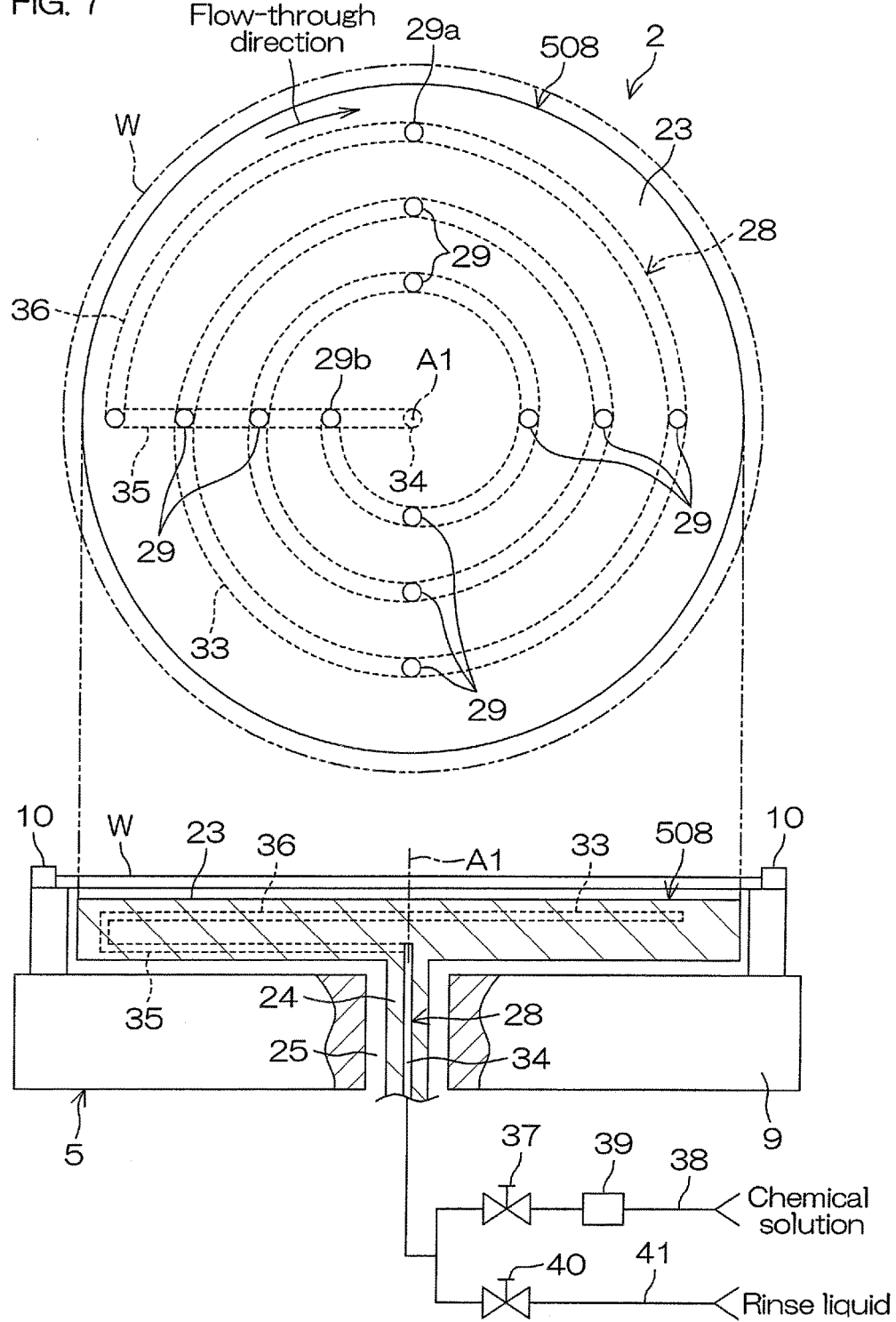
FIG. 7 is a schematic view showing an upper surface and a longitudinal section of a lower surface nozzle according to a fifth preferred embodiment of the present invention.

Also, in the first and second preferred embodiments, a description has been given of the case in which the first flow passage 33 has a broken line shape, but as in the lower surface nozzle 408 shown in FIG. 6, the first flow passage 33 may have a curved shape. Alternatively, as in the lower surface nozzle 508 shown in FIG. 7, the first flow passage 33 may be in a hericoidal shape that extends circumferentially toward the downstream side while approaching the rotation axis A1. In this case, the upstream portion 35 and the downstream portion 36 may be disposed on the same plane as shown in FIG. 6, or may be disposed on planes different from each other as shown in FIG. 7.

Figure 8:
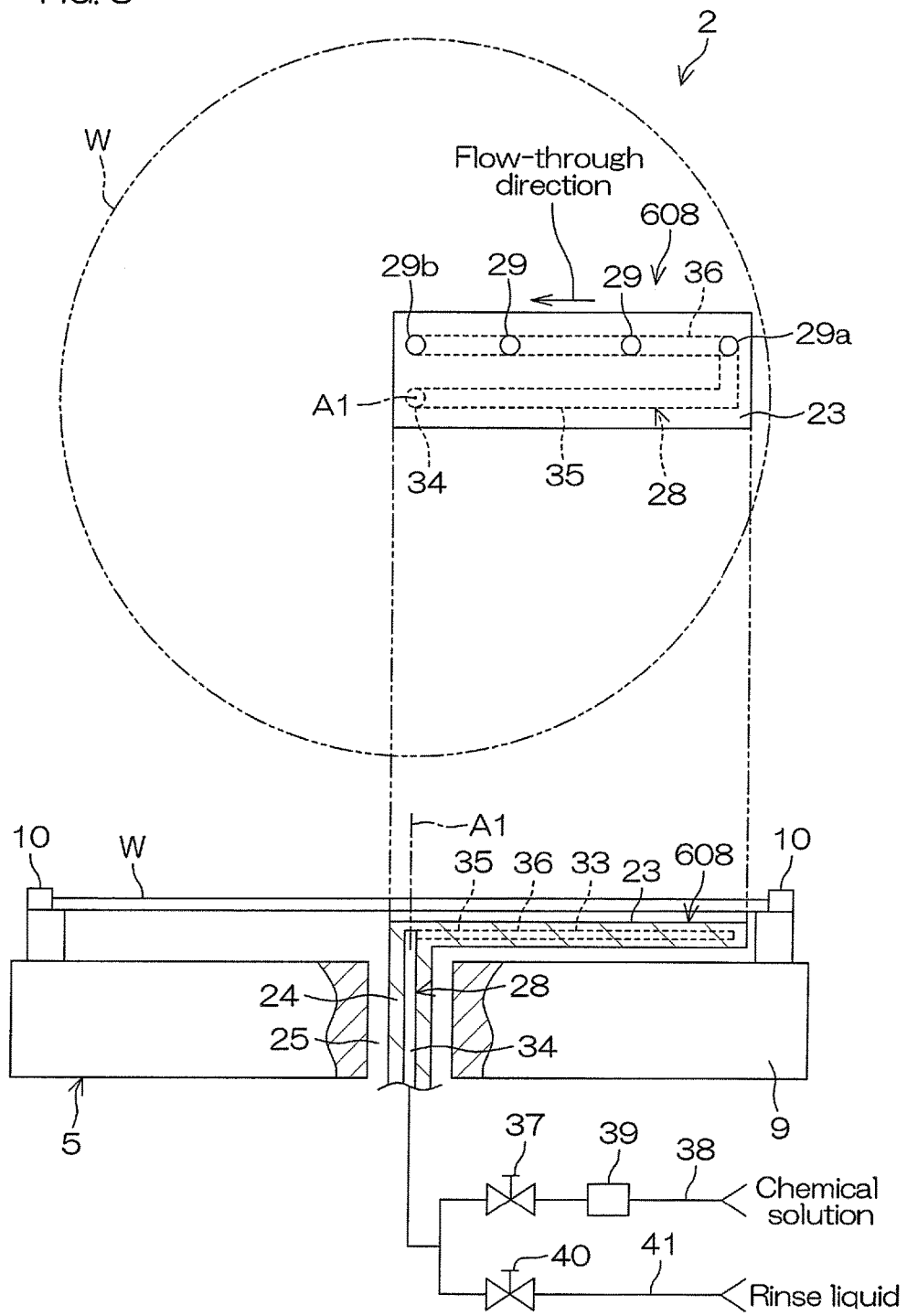
FIG. 8 is a schematic view showing an upper surface and a longitudinal section of a lower surface nozzle according to a sixth preferred embodiment of the present invention.
Figure 9:
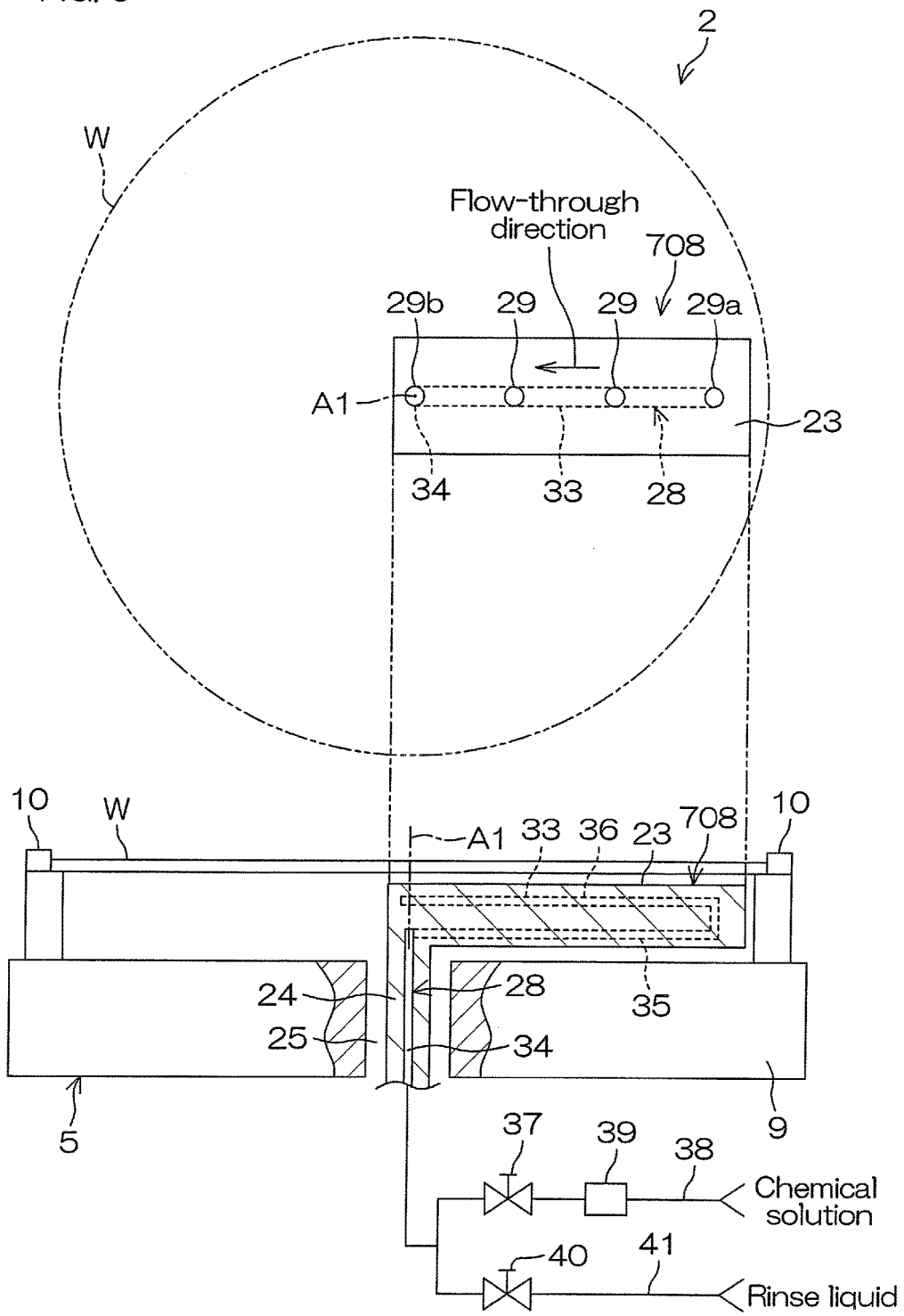
FIG. 9 is a schematic view showing an upper surface and a longitudinal section of a lower surface nozzle according to a seventh preferred embodiment of the present invention.

Also, in the first and second preferred embodiments, a description has been given of the case in which the discharge portion 23 of the lower surface nozzle 8 has a disk shape, but as in the lower surface nozzle 608 shown in FIG. 8, the discharge portion 23 may have a bar shape extending radially outward from the rotation axis A1. Similarly, as in the lower surface nozzle 708 shown in FIG. 9, the discharge portion 23 may be in a bar shape extending radially outward from the rotation axis A1. In this case, the upstream portion 35 and the downstream portion 36 may be disposed on the same plane as shown in FIG. 8, or may be disposed on planes different from each other as shown in FIG. 9. Also, the downstream portion 36 may extend along a straight line that connects two discharge ports 29 adjacent in the flow-through direction.

Also, in the first and second preferred embodiments, a description has been given of the case in which the flow passage 28 and the plurality of discharge ports 29 are provided in the lower surface nozzle 8, but the flow passage 28 may be disposed in the interior of the shielding plate 6, and the plurality of discharge ports 29 may be opened in the lower surface of the shielding plate 6. That is, the flow passage 28 and the plurality of discharge ports 29 may be provided in only either one of the lower surface nozzle 8 and the shielding plate 6, or may be provided in both of the lower surface nozzle 8 and the shielding plate 6. When the flow passage 28 and the plurality of discharge ports 29 are provided in the shielding plate 6, the shape of the flow passage 28 may be the shape shown in any of FIG. 2, FIG. 5, FIG. 6, and FIG. 7.

Also, in the first and second preferred embodiments, a description has been given of the case in which a chemical solution of a temperature higher than room temperature is supplied to the flow passage 28, but a high-temperature processing liquid other than a chemical solution may be supplied to the flow passage 28. For example, pure water of a temperature higher than room temperature may be supplied to the flow passage 28. Because the replacement ability of pure water may decline if the temperature of pure water falls, the processing liquid on the substrate W can be uniformly replaced with pure water by making the temperature of pure water on the substrate W uniform throughout the entire surface.

Also, in the second preferred embodiment, a description has been given of the case in which the cooling structure 42 includes a cooling member 43, a cooling liquid retention space 45, and a cooling liquid flow passage 46, but one or two of the cooling member 43, the cooling liquid retention space 45, and the cooling liquid flow passage 46 may be omitted.

Also, in the first and second preferred embodiments, a description has been given of the case in which the substrate processing apparatus 1 is an apparatus that processes disk-shaped substrates W, but the substrate processing apparatus 1 may be an apparatus that processes polygonal substrates W such as liquid crystal display device substrates.

While preferred embodiments of the present invention have been described in detail, these are merely specific examples used to clarify the technical content of the present invention, and the present invention should not be interpreted as being limited to only these specific examples, and the spirit and scope of the present invention shall be limited only by the accompanying claims.

The present application corresponds to Japanese Patent Application No. 2012-078181 filed on Mar. 29, 2012 in the Japan Patent Office, and the entire disclosure of this application is incorporated herein by reference.

REFERENCE SIGNS LIST

1: Substrate processing apparatus
3: Control device
5: Spin chuck (substrate holding means)
6: Shielding plate (discharging member, downward discharging member)
8: Lower surface nozzle (discharging member, upward discharging member)
12: Spin motor (substrate rotating means)
28: Flow passage
29: Plurality of discharge ports
35: Upstream portion
36: Downstream portion
37: Chemical solution valve (switching device)
38: Chemical solution pipe (high-temperature processing liquid pipe)
40: Rinse liquid valve (switching device)
41: Rinse liquid pipe (low-temperature processing liquid pipe)
42: Cooling structure (cooling structure)
43: Cooling member (cooling substance)
44: Disposition space (cooling substance disposition space)
45: Cooling liquid retention space
46: Cooling liquid flow passage (cooling liquid retention space)
47: Cooling liquid supply passage
48: Cooling liquid discharge passage
208: Lower surface nozzle (discharging member, upward discharging member)
308: Lower surface nozzle (discharging member, upward discharging member)
408: Lower surface nozzle (discharging member, upward discharging member)
508: Lower surface nozzle (discharging member, upward discharging member)
608: Lower surface nozzle (discharging member, upward discharging member)
708: Lower surface nozzle (discharging member, upward discharging member)
A1: Rotation axis
W: Substrate

What is claimed is:
1. A substrate processing apparatus comprising:
a substrate holding unit that holds a substrate horizontally;
a substrate rotating unit that rotates the substrate held by the substrate holding unit about a vertical rotation axis passing through the substrate;
an upward discharging member that is disposed under a position where the substrate is held by the substrate holding unit that includes a plurality of discharge ports respectively disposed at a plurality of positions different in distance from the rotation axis, and a flow passage connected sequentially to the plurality of discharge ports in order from outside to inside in a flow-through direction, and that discharges a processing liquid supplied from the flow passage in the flow- through direction to the plurality of discharge ports from the plurality of discharge ports toward the substrate; and a first processing liquid pipe that supplies a processing liquid of a temperature higher than that of the upward discharging member to the flow passage;

wherein the upward discharging member further includes a disk-shaped discharging portion opposed in parallel to the substrate held by the substrate holding unit and provided with the plurality of discharge ports;

the flow passage includes a first flow passage provided in the discharging portion and disposed on a plane;

the first flow passage includes an upstream portion that is disposed in an upstream direction from an outermost discharge port among the plurality of discharge ports and the upstream portion extends from the rotation axis to an outer peripheral portion of the upward discharging member in the flowthrough direction, and a downstream portion connected to the upstream portion and disposed in a same plane as that of the upstream portion and extending in the flow-through direction to be closer to the rotation axis than the outermost discharge port; and the plurality of discharge ports include two discharge ports disposed at different respective rotation radiuses from the rotation axis and adjacent in the flow-through direction.

2. The substrate processing apparatus according to claim 1, wherein the flow passage extends from one to the other of two discharge ports adjacent in the flow-through direction, through a path different from a straight line to connect the two discharge ports when viewed in a direction perpendicular to the substrate held by the substrate holding unit.

3. The substrate processing apparatus according to claim 1, further comprising:

a second processing liquid pipe that supplies the flow passage with a processing liquid of a temperature lower than that of a processing liquid that is supplied from the first processing liquid pipe to the flow passage;

a switching device capable of opening and closing an interior of the first processing liquid pipe and second processing liquid pipe such that a processing liquid is selectively supplied to the flow passage from either one of the first processing liquid pipe and second processing liquid pipe; and a control device that, by controlling the switching device, executes a first processing liquid supplying step of supplying a processing liquid from the first processing liquid pipe to the flow passage, and a second processing liquid supplying step of supplying a processing liquid from the second processing liquid pipe to the flow passage after the first processing liquid supplying step.

4. The substrate processing apparatus according to claim 1, further comprising:

a cooling structure including a cooling substance disposition space which is provided in an interior of the upward discharging member and in which a cooling substance to cool the upward discharging member is disposed.

5. The substrate processing apparatus according to claim 4, wherein the cooling structure further includes a cooling member serving as the cooling substance, having a smaller specific heat than that of the upward discharging member.

6. The substrate processing apparatus according to claim 4, wherein the cooling substance disposition space is separate from the flow passage and includes a cooling liquid retention space to retain a cooling liquid serving as the cooling substrate.

7. The substrate processing apparatus according to claim 6, wherein the cooling liquid retention space is a sealed space filled with the cooling liquid.

8. The substrate processing apparatus according to claim 6, wherein the cooling structure includes a cooling liquid flow passage serving as the cooling liquid retention space, a cooling liquid supply passage which is connected to the cooling liquid flow passage and supplies a cooling liquid to the cooling liquid flow passage, and a cooling liquid discharge passage which is connected to the cooling liquid flow passage and discharges a cooling liquid in the cooling liquid flow passage.

* * * * *